US007717079B2

(12) United States Patent
Yamamura et al.

(10) Patent No.: US 7,717,079 B2
(45) Date of Patent: May 18, 2010

(54) ENGINE

(75) Inventors: Satoshi Yamamura, Saitama (JP); Kazuo Shibata, Saitama (JP); Kiyoyuki Kawai, Tokyo (JP)

(73) Assignees: Honda Motor Co., Ltd., Tokyo (JP); Teikoku Piston Ring CO., Ltd., Tokyo (JP)

( * ) Notice: Subject to any disclaimer, the term of this patent is extended or adjusted under 35 U.S.C. 154(b) by 124 days.

(21) Appl. No.: 11/878,154

(22) Filed: Jul. 20, 2007

(65) Prior Publication Data

US 2008/0017160 A1 Jan. 24, 2008

(30) Foreign Application Priority Data

Jul. 20, 2006 (JP) ............................ 2006-198342

(51) Int. Cl.
*C23C 14/06* (2006.01)
*F02F 5/00* (2006.01)
*F16J 9/26* (2006.01)

(52) U.S. Cl. ................................ 123/193.6; 123/193.4

(58) Field of Classification Search .............. 123/193.6, 123/193.4, 193.2; 29/888.061, 888.074
See application file for complete search history.

(56) References Cited

U.S. PATENT DOCUMENTS

| | | | | |
|---|---|---|---|---|
| 5,106,702 | A | 4/1992 | Walker et al. | |
| 5,131,356 | A | 7/1992 | Sick et al. | |
| 5,618,590 | A * | 4/1997 | Naruse et al. | 427/528 |
| 5,835,841 | A | 11/1998 | Yamada et al. | |
| 6,887,585 | B2 | 5/2005 | Herbst-Dederichs | |
| 7,073,476 | B2 * | 7/2006 | Yamamura et al. | 123/195 R |

FOREIGN PATENT DOCUMENTS

| | | | | |
|---|---|---|---|---|
| DE | 195 48 718 | C1 | 5/1997 | |
| DE | 198 25 860 | A1 | 12/1999 | |
| DE | 199 11 533 | B4 | 11/2005 | |
| DE | 2006 046 917 | B3 * | 4/2006 | 123/193.2 |
| EP | 0 449 356 | A1 | 10/1991 | |
| EP | 1 059 133 | A1 | 12/2000 | |
| JP | S47-35446 | A | 11/1972 | |
| JP | 406207555 | A * | 7/1994 | 123/193.2 |
| JP | 07-286262 | A | 10/1995 | |
| JP | 2002-256967 | A | 9/2002 | |
| JP | 2005-029858 | A | 2/2005 | |
| JP | 2005-186151 | A | 7/2005 | |
| JP | 2006-002606 | A | 1/2006 | |
| JP | 2006-002606 | A | 5/2006 | |

* cited by examiner

*Primary Examiner*—Marguerite J. McMahon
(74) *Attorney, Agent, or Firm*—Arent Fox LLP

(57) ABSTRACT

An engine includes: a cylinder block; and a piston ring, in which the cylinder block has a cylinder liner portion formed of an aluminum-based composite reinforced by a ceramic containing at least either of a silicon carbide and an alumina, and in which the piston ring is coated with a nitride film (20) including a vanadium nitride layer (21) exposed on an outer circumferential sliding surface (17).

3 Claims, 8 Drawing Sheets

ENGINE

CROSS-REFERENCE TO RELATED APPLICATION(S)

This application claims the foreign priority benefit under Title 35, United States Code, §119 (a)-(d), of Japanese Patent Application No. 2006-198342 filed on Jul. 20, 2006 in the Japan Patent Office, the disclosure of which is herein incorporated by reference in its entirety.

BACKGROUND OF THE INVENTION

1. Field of the Invention

The present invention relates to an engine.

2. Description of the Related Art

In recent years, the combustion pressure of engine has become higher and higher to achieve a high output power. Therefore, it is desired to provide a cylinder block having high rigidity and high strength to withstand the higher combustion pressure. As a result, in such an engine, since attack to a piston ring which slides against the cylinder is increased, it is necessary to improve durability (wear resistance, etc.) of the piston ring. There is conventionally known a piston ring having a nitride chromium film formed on an outer circumferential sliding portion thereof (refer to, for example, Patent Document 1: Japanese Patent Laid-Open Publication No. Hei07-286262, paragraphs [0023] to [0026] and others). Such a piston ring is excellent in durability compared with a conventional piston ring plated with hard chromium or a conventional piston ring subjected to a nitriding treatment.

Further, there is conventionally known a piston ring coated with a VN-based film. This type of the piston ring is more excellent in durability, and particularly excellent in crack resistance and peeling resistance (refer to, for example, Patent Document 2: Japanese Patent Laid-Open Publication No. 2002-256967, paragraphs [0004] to [0007] and others).

On the other hand, in order to reduce the weight and size of the engine, a cylinder block formed of an aluminum-based composite is employed (refer to, for example, Patent Document 3: Japanese Patent Laid-Open Publication No. 2005-186151, paragraphs [0010] to [0014] and others). The aluminum-based composite is formed by, for example, incorporating single filaments or particles formed of alumina ($Al_2O_3$), silica ($SiO_2$), carbon or the like into a matrix metal such as ADC12, so that the weight of the cylinder block can be reduced. However, the rigidity and strength of the aluminum-based composite is not sufficient compared with a cast iron, therefore combustion pressure of the engine can not be sufficiently increased.

Further, there has been known an aluminum-based composite formed by filling aluminum into pores of a porous ceramic, and Patent Document 4 (Japanese Patent Laid-Open Publication No. 2006-2606, paragraphs [0021] to [0031] and others) discloses a cylinder block whose cylinder liner portion is formed of the aluminum-based composite. Since the pores of the porous ceramic has a three-dimensional network structure formed by a plurality of spherical cells and communication holes which communicate the plurality of spherical cells adjacent to each other, the cylinder block is imparted with a rigidity and strength high enough to withstand a higher combustion pressure.

However, on the other hand, attack to the piston ring is further increased for the cylinder block formed by the porous ceramic (refer to, for example, Patent document 4) as compared with the cylinder block formed by the aluminum-based composite (refer to, for example, Patent Document 3). Thus, there is a concern that even if a piston ring which exhibits excellent durability against a conventional cast iron cylinder block (refer to, for example, Patent Document 1 and Patent Document 2) will not have sufficient durability against the cylinder block disclosed in Patent Document 4. Thus, it is necessary to provide a piston ring with high durability for a piston to be paired with the cylinder block formed by the porous ceramic.

SUMMARY OF THE INVENTION

An object of the present invention is to provide an engine constructed by a combination of a cylinder block formed of an aluminum-based composite using a ceramic and a piston ring more excellent in durability than a conventional piston ring.

An engine according to an aspect of the present invention includes: a cylinder block whose cylinder liner portion is formed of an aluminum-based composite reinforced by a ceramic containing at least either of a silicon carbide and an alumina; and a piston ring coated with a nitride film having a vanadium nitride layer exposed on an outer circumferential sliding surface.

In such an engine, since the piston ring wears less against the cylinder block formed of the aluminum-based composite reinforced by the ceramic, the piston ring is excellent in durability.

It is preferred that in the aforesaid engine, the nitride film further includes at least either of a zirconium nitride layer and a titanium nitride layer.

In such an engine, since at least either of a zirconium nitride layer and a titanium nitride layer is further provided, the piston ring is excellent in seizure resistance compared to a conventional piston ring (refer to, for example, Patent Document 1).

It is preferred that in the aforesaid engine, the vanadium nitride layer and the at least either of the zirconium nitride layer and the titanium nitride layer are laminated repeatedly and alternately, and the laminated layers are formed in wave shape.

In such an engine, by establishing a matching between the vanadium nitride layer and the zirconium nitride layer or the titanium nitride layer (the matching is achieved by making crystal orientations of the materials of respective layers identical with each other), mutual bonding force between respective layers is increased. Thus, in such an engine, the piston ring has excellent wear resistance against the cylinder block whose cylinder liner portion is reinforced by the ceramic.

Further, it is preferred that in the aforesaid engine, the vanadium nitride layer and the at least either of the zirconium nitride layer and the titanium nitride layer are exposed on the outer circumferential sliding surface to form a sea and islands structure.

In such an engine, since the vanadium nitride layer and the at least either of the zirconium nitride layer and the titanium nitride layer are exposed on the outer circumferential sliding surface to form a sea and islands structure, excellent wear resistance and excellent seizure resistance of the piston ring, with respect to the cylinder block whose cylinder liner portion is reinforced by the ceramic, can both be achieved in good balance.

Further, it is preferred that in the nitride film of the aforesaid engine, the composition ratio of vanadium and the composition ratio of zirconium or titanium satisfy the equation "$0<b/(a+b)\leqq 0.6$", where "a" represents atom % of vanadium, and "b" represents atom % of zirconium or titanium.

In such an engine, the composition ratio of vanadium and the composition ratio of zirconium of the nitride film satisfy the equation "$0<b/(a+b)\leqq 0.6$". Due to the provision of such a nitride film, the piston ring has excellent seizure resistance against the cylinder block whose cylinder liner portion is reinforced by the ceramic, and has more excellent wear resistance than the piston ring coated with a nitride film that does not satisfy the above equation. In other words, if the aforesaid composition ratio exceeds "b/(a+b)", the wear resistance tends to decrease somewhat.

Further, it is preferred that in the aforesaid engine, the volume ratio Vf of the ceramic for reinforcing the cylinder liner portion is within a range of "10%<Vf<40%".

In such an engine, the cylinder block has sufficient strength, and the piston ring has sufficient wear resistance. Incidentally, if the volume ratio Vf is lower than 10%, there is possibility that the strength of the cylinder block will decrease. Further, if the volume ratio Vf is higher than 40%, there is possibility that the wear resistance of the cylinder block will decrease.

Further, it is preferred that in the aforesaid engine, the ceramic for reinforcing the cylinder liner portion is a porous ceramic having its pores filled with aluminum, the pores consisting of a plurality of spherical cells and a plurality of communication holes which are linked to each other to form a three-dimensional network structure, in which the plurality of the spherical cells have substantially uniform inner diameter and are closely arranged, and the plurality of the communication holes communicate the plurality of spherical cells adjacent to each other.

In such an engine, the strength of the cylinder block can be further increased.

DETAILED DESCRIPTION OF PREFERRED EMBODIMENT(S)

Figure 1:
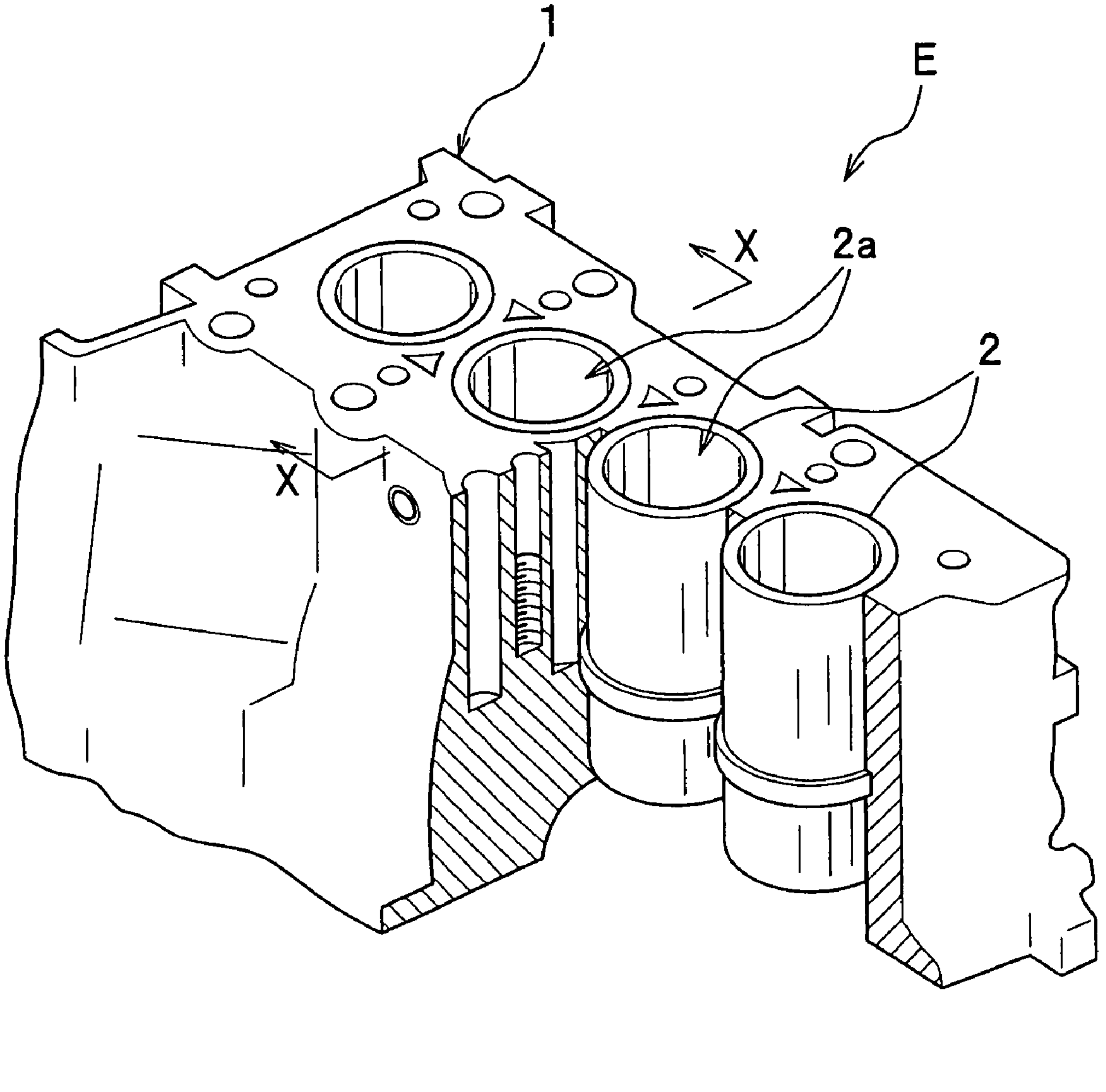
FIG. 1 is a perspective view showing a structure of an engine according to an embodiment of the present invention.
Figure 2:
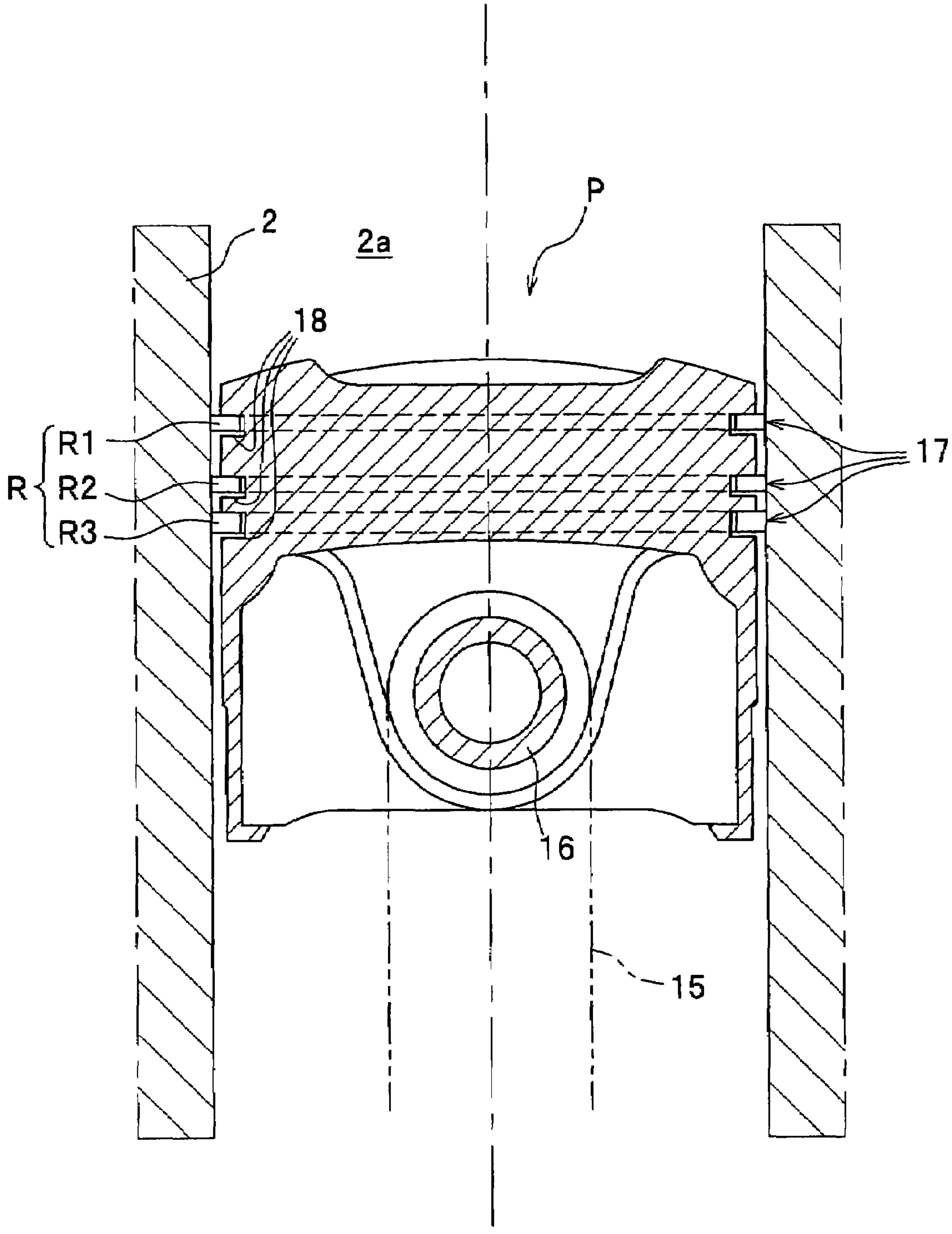
FIG. 2 is a partial cross section taken along line X-X of FIG. 1.
Figure 3:
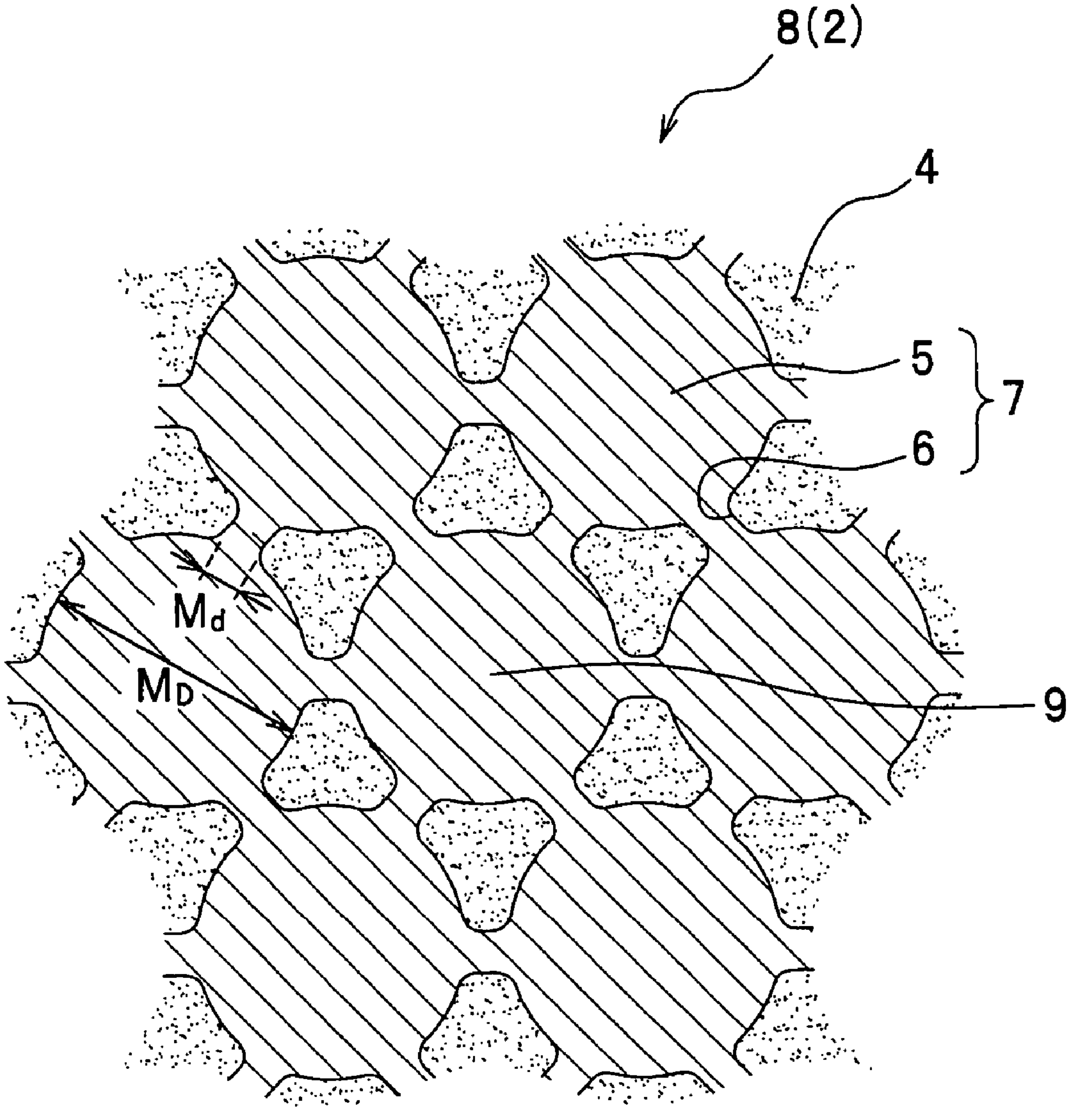
FIG. 3 is a schematic illustration showing an aluminum-based composite forming a cylinder liner.
Figure 4:
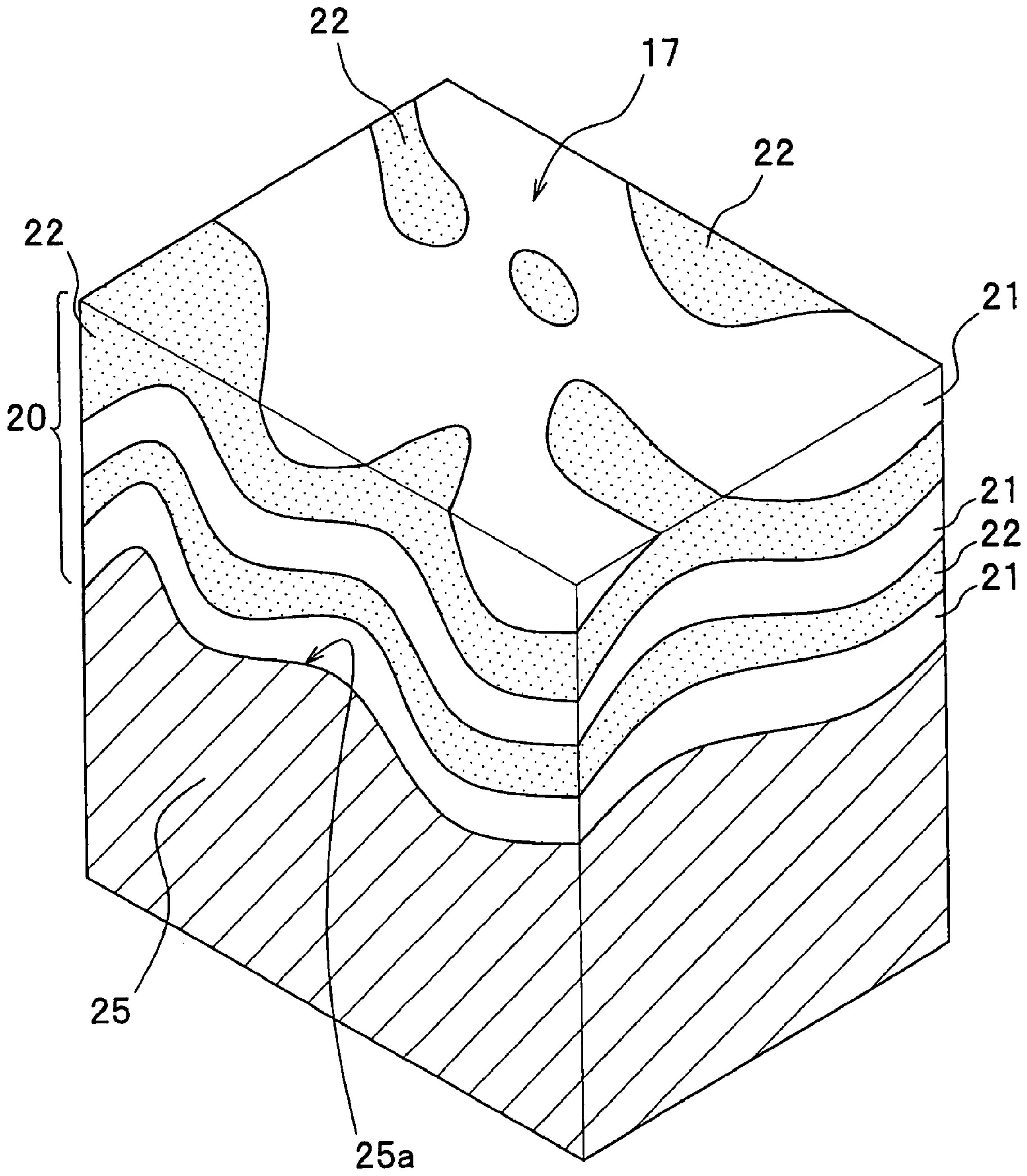
FIG. 4 is a perspective view schematically showing a structure of a nitride film of a piston ring.

An embodiment of the present invention will be described with reference to the attached drawings. FIG. 1 is a perspective view showing a structure of an engine according to the embodiment of the present invention. FIG. 2 is a partial cross section taken along line X-X of FIG. 1. FIG. 3 is a schematic illustration showing an aluminum-based composite forming a cylinder liner. FIG. 4 is a perspective view schematically showing a structure of a nitride film of a piston ring. Incidentally, the description herein is based on an in-line four-cylinder type gasoline engine.

As shown in FIG. 1, an engine E includes a cylinder block 1 and a below-described piston 3 (see FIG. 2). The engine E is provided with a gasket (not shown), a cylinder head (not shown) and a head cover (not shown) above the cylinder block 1, and is provided with a lower case (not shown) and an oil pan (not shown) on the lower side of the cylinder block 1.

The cylinder block 1 is integral with a cylinder liner 2 formed of a below-described aluminum-based composite 8 (see FIG. 3). The cylinder block 1 has the same structure as a known cylinder block, except for having the cylinder liner 2. As shown in FIG. 2, the cylinder liner 2 is a cylindrical member, in which a bore 2*a* is formed for accommodating a piston P. Incidentally, the cylinder liner 2 here corresponds to the "cylinder liner portion" described in the claims of the present invention.

As shown in FIG. 3, the aluminum-based composite 8 forming the cylinder liner 2 (see FIG. 1) is reinforced by a ceramic form 4, which corresponds to the "porous ceramic" described in the claims of the present invention. In other words, the aluminum-based composite 8 is formed by filling aluminum 9 into the pores (a plurality of spherical cells 5 and communication holes 6) of the ceramic form 4.

The plurality of spherical cells 5 having substantially uniform inner diameter are arranged closely and uniformly in the ceramic form 4 preferably in a closely-packed manner.

The communication holes 6 communicate the plurality of spherical cells 5 adjacent to each other. The spherical cells 5 and communication holes 6 form a three-dimensional net structure 7 inside the ceramic form 4.

Incidentally, the inner diameter of the communication holes 6 is determined in accordance with the inner diameter of the spherical cells 5, and it is preferred that the ratio of the median (Md) of the inner diameter of the communication holes 6 to the median (MD) of the inner diameter of the spherical cells 5 (i.e., the Md/MD) is less than 0.5. By determining the inner diameter of the communication holes 6 in such a manner, the coefficient of thermal expansion of the cylinder liner 2 can be reduced.

The ceramic form 4 formed in such a manner is composed of at least either of a silicon carbide and an alumina. The aluminum-based composite 8 is formed by filling a molten aluminum into the spherical cells 5 and the communication holes 6 of the ceramic form 4. An aluminum alloy generally used for diecasting, such as ADC12, can be used as the aluminum 9. It is preferred that the volume ratio Vf of the ceramic form 4 of the aluminum-based composite 8 is within a range of 10% to 40%.

The piston P will be described below. As generally known, the piston P has substantially cylindrical outline, and is attached to a connecting rod 15 through a piston pin 16 so as to be reciprocated inside the bore 2*a* as shown in FIG. 2.

The circumferential surface of the piston P is formed with three piston ring grooves 18, each having a piston ring R fitted therein.

The piston ring R includes a first compression ring R1, a second compression ring R2 and an oil ring R3, arranged in this order from the crown side of the piston P (i.e., the upper side of FIG. 2). The piston ring R has an outer circumferential sliding surface 17, which slides against the inner surface of the cylinder liner 2, formed on the outer circumference thereof.

The piston ring R is provided with a nitride film which forms the outer circumferential sliding surface 17. As shown in FIG. 4, the nitride film 20 is a thin film formed on an outer circumferential surface 25*a* of a piston ring base material 25 having substantially the same shape as the piston ring R (see FIG. 2). The nitride film 20 includes layers 21 formed of vanadium nitride (VN) (hereinafter referred to as "vanadium nitride layers 21") and layers 22 formed of zirconium nitride (ZrN) (hereinafter referred to as "zirconium nitride layers 22"). Incidentally, known materials, such as a martensitic stainless steel, can be used for the piston ring base material 25.

The nitride film 20 of the present embodiment is formed by alternately laminating the vanadium nitride layer 21 and the zirconium nitride layer 22 on the piston ring base material 25 so that a plurality of laminated layers are formed. The vanadium nitride layer 21 and the zirconium nitride layer 22 are respectively formed in wave shape.

The vanadium nitride layer 21 and the zirconium nitride layer 22 are exposed on the outer circumferential sliding surface 17 to form a sea and islands structure. Incidentally, the nitride film 20 can have such a structure in which the vanadium nitride layer 21 is exposed on the outer circumferential sliding surface 17 like sea and the zirconium nitride layer 22 is exposed like islands, or the nitride film 20 can have such a structure in which the zirconium nitride layer 22 is exposed on the outer circumferential sliding surface 17 like sea and the vanadium nitride layer 21 is exposed like islands.

It is preferred that in the nitride film 20, the composition ratio of the vanadium (V) and the composition ratio of the zirconium (Zr) satisfy the following equation (1).

$$0<b/(a+b)\leqq 0.6 \quad (1)$$

(In the above equation (1), "a" represents atom % of vanadium and "b" represents atom % of zirconium contained in the nitride film 20)

Advantages of the engine E according to the present embodiment will be described below.

The aluminum-based composite 8 is used to form the cylinder block 1 (more specifically, the cylinder liner 2) of the engine E, and the aluminum-based composite 8 is formed by filling aluminum 9 into the pores, which form the three-dimensional net structure 7, of the ceramic form 4 (i.e., the porous ceramic). Thus, the cylinder block 1 of the engine E has a rigidity and strength high enough to withstand a higher combustion pressure.

Further, in the engine E, since the cylinder block 1 (more specifically, the cylinder liner 2) is formed of the aluminum-based composite 8, attack to the piston ring R is further increased as compared with a conventional cylinder block (refer to, for example, Patent Document 3). On the other hand, in the engine E, since the nitride film 20 containing the vanadium nitride layer 21 is formed on the piston ring R which slides against the cylinder block 1 (more specifically, the cylinder liner 2), the piston ring R is more excellent in durability as compared with a conventional piston ring (refer to, for example, Patent Document 1).

Further, in the piston ring R, since the zirconium nitride layer 22 is exposed on the outer circumferential sliding surface 17, the piston ring R is excellent in seizure resistance to the cylinder liner 2 (see FIG. 1) as compared with a conventional piston ring (refer to, for example, Patent Document 1). Further, since the vanadium nitride layer 21 and the zirconium nitride layer 22 are exposed on the outer circumferential sliding surface 17 to form a sea and islands structure, excellent wear resistance and excellent seizure resistance can both be achieved in good balance.

Further, in the piston ring R, since the vanadium nitride layer 21 and the zirconium nitride layer 22, which form the nitride film 20, are formed in wave shape, mutual bonding force between respective layers is increased by establishing a matching between respective layers of the vanadium nitride layer 21 and the zirconium nitride layer 22 (the matching is achieved by making crystal orientations of the materials of respective layers identical with each other). Further, even in the case where the nitride film 20 has been worn due to longtime operation, since the vanadium nitride layer 21 and the zirconium nitride layer 22 of the piston ring R are formed in wave shape, the vanadium nitride layer 21 and the zirconium nitride layer 22 are constantly exposed on the outer circumferential sliding surface 17 to form a sea and islands structure. As a result, excellent wear resistance and excellent seizure resistance of the piston ring R can be achieved in good balance even when the piston ring R has been worn.

Further, since the composition ratio of the vanadium and the composition ratio of the zirconium of the nitride film 20 satisfy the above equation (1), the piston ring R is not only excellent in seizure resistance, but also excellent in wear resistance.

Figure 5:
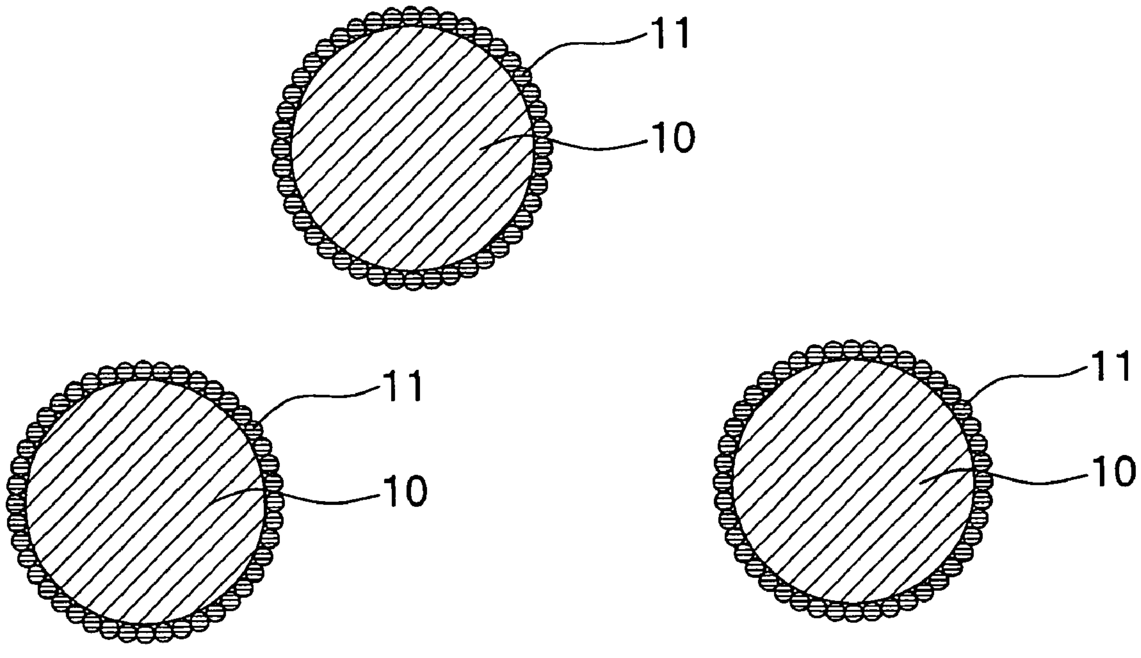
FIG. 5 is a view conceptually showing microspheres coated with ceramic particles as a raw material for a ceramic form.
Figure 6:
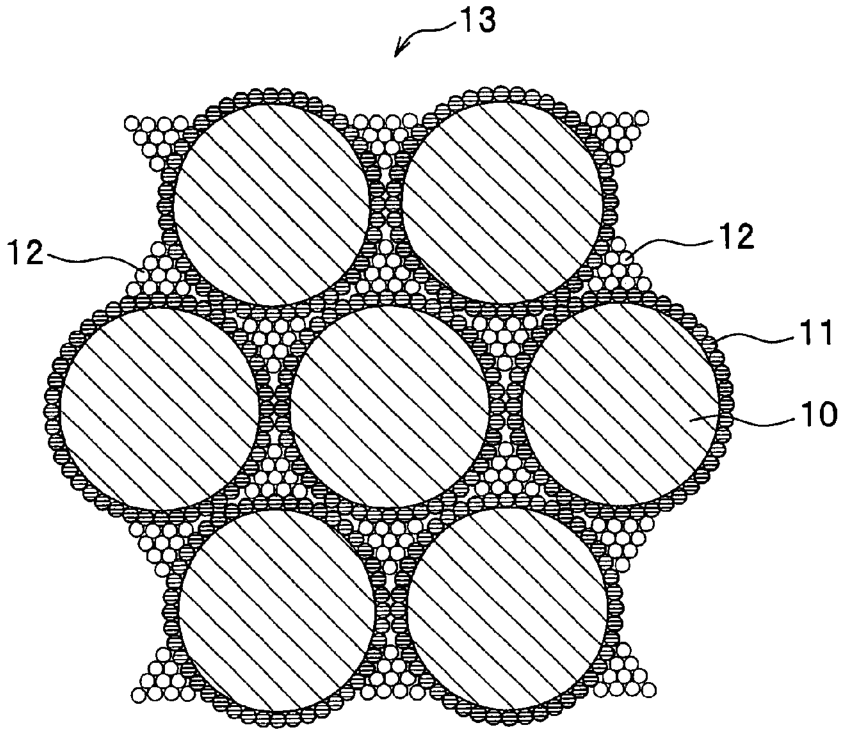
FIG. 6 is a view conceptually showing a form material as a raw material for the ceramic form.
Figure 7:
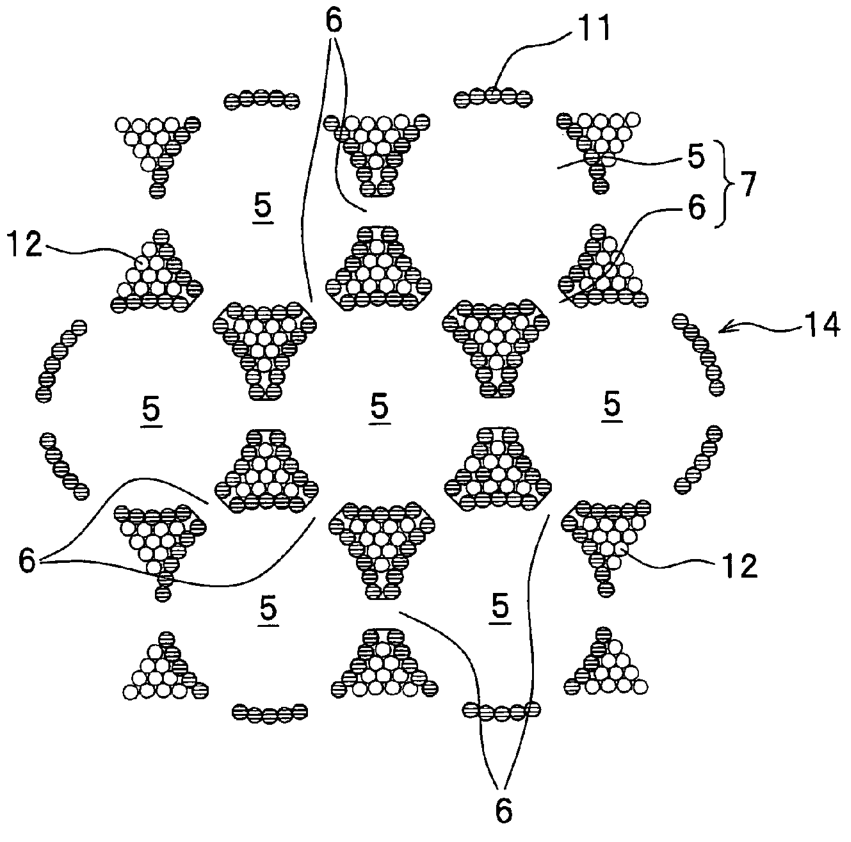
FIG. 7 is a view conceptually showing a form-to-be-sintered as a raw material for the ceramic form.

A manufacturing method of the engine E according to present embodiment, particularly, a manufacturing method of the cylinder block 1 and a manufacturing method of the piston ring R will described with reference to the drawings. Among the drawings, FIG. 5 is a view conceptually showing microspheres coated with ceramic particles as raw material for the ceramic form. FIG. 6 is a view conceptually showing a form material as a raw material for the ceramic form. FIG. 7 is a view conceptually showing a form-to-be-sintered as a raw material for the ceramic form.

In this manufacturing method, the ceramic form 4, which is a base material of the cylinder liner 2, is formed firstly. At this time, as shown in FIG. 5, the surface of microspheres 10, which evaporate at a predetermined temperature, is coated with ceramic particles 11. Incidentally, examples of material for the microsphere 10 include resin such as polymethyl acrylate (polymethyl methacrylate), polystyrene and the like. Examples of material for the ceramic particles 11 include material containing at least either of the silicon carbide and the alumina.

Then, as shown in FIG. 6, "the microspheres 10 coated with ceramic particles 11" huddle near each other, and ceramic powder 12 is filled between "the microspheres 10 coated with ceramic particles 11", so that a form material 13 is formed. Incidentally, the same material as the ceramic particles 11 can be used for ceramic powder 12.

Further, the microspheres 10 are burned out by heating the form material 13 to a predetermined temperature. As a result, as shown in FIG. 7, the portions where the microspheres 10 (see FIG. 10) of the form material 13 existed are emptied to become the spherical cells 5. On the other hand, owing to the gas pressure generated when the microspheres 10 are evaporated, the ceramic particles 11 coating the microspheres 10 break off. At this time, the ceramic particles 11 near the places where spherical cells 5 adjacent to each other preferentially break off. As a result, the communication holes 6 communicating the spherical cells 5 with each other are formed.

The form material 13 (see FIG. 6), in which the spherical cells 5 and the communication holes 6 are formed, is turned into a form-to-be-sintered 14 by being heated to the predetermined temperature.

Incidentally, in the form-to-be-sintered 14, the plurality of spherical cells 5 are arranged in the form-to-be-sintered 14 in a closely-packed manner, and the ceramic particles 11 have the three-dimensional net structure 7 as shown in FIG. 7. Further, by sintering the form-to-be-sintered 14, the ceramic particles 11 and the ceramic powder 12 surrounding the spherical cells 5 are sintered to each other. As a result, the form-to-be-sintered 14 becomes the ceramic form 4 as shown in FIG. 3, and is formed into the shape of cylinder liner 2 as shown in FIG. 1.

Then, the molten aluminum 9 is poured into a predetermined mold of the cylinder block 1 with the ceramic forms 4 inserted as a filler material. By pouring the aluminum 9 into the spherical cells 5 and the communication holes 6 of the ceramic form 4, the cylinder liners 2 are formed, and at the same time the cylinder block 1 having the cylinder liners 2 is formed.

Figure 8:
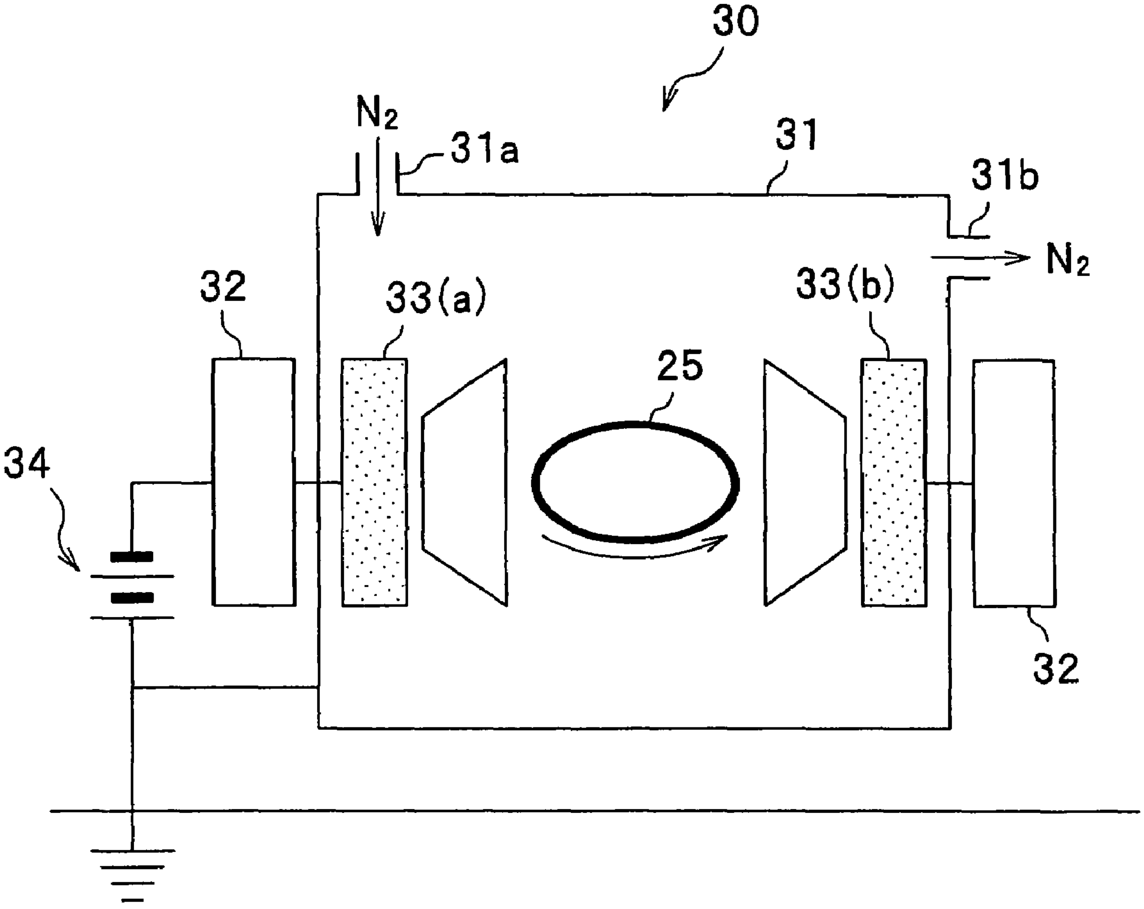
FIG. 8 is a diagram showing a structure of a device for manufacturing a piston ring according to the embodiment.

The manufacturing method of the piston ring R will be described below with reference to the drawings. Among the drawings, FIG. 8 is a diagram showing a structure of a device for manufacturing the piston ring according to the embodiment.

The piston ring R can be manufactured using a known device in which the nitride film 20 including the vanadium nitride and the zirconium nitride is grown on the outer circumferential surface 25*a* of the piston ring base material 25. Examples of such device include devices capable of performing a PVD method, a reactive ion plating method or the like. The following description is based on a known device (hereinafter referred to as "manufacturing device") capable of performing an arc ion plating method. As shown in FIG. 8, the manufacturing device 30 mainly includes a reaction chamber 31 in which the piston ring base material 25 is housed, arc discharge generators 32, a first target 33*a* formed of a metal vanadium, a second target 33*b* formed of a metal zirconium, a work table (not shown) for rotating the piston ring base material 25, and a bias power source (not shown) for setting a bias potential for the piston ring base material 25.

Nitrogen ($N_2$, as process gas) is introduced into the reaction chamber 31 through a supply port 31*a*. The introduced Nitrogen ($N_2$) is discharged from an outlet port 31*b* of the reaction chamber 31.

The arc discharge generator 32 is for generating an arc discharge in the reaction chamber 31 by a power source 34, and the first target 33*a* and the second target 33*b* are each provided with the arc discharge generator 32. The arc discharge generators 32 can individually generate arc discharge. First, the arc discharge generator 32 on the first target 33*a* side generates an arc discharge to ionize the metal vanadium of the first target 33*a* on the cathode side. Together with the Nitrogen, the vanadium ions generated in the reaction chamber 31 are attracted to the side of the piston ring base material 25, to which the bias potential is set. Therefore the vanadium nitride layer 21 (see FIG. 4) is formed on the outer circumferential surface 25*a* of the rotating piston ring base material 25 (see FIG. 4). On the other hand, as shown in FIG. 4, since the outer circumferential surface 25*a* of the piston ring base material 25 is formed with microscopically wave-shaped concavities and convexities, the vanadium nitride layer 21 is formed in wave shape along the outer circumferential surface 25*a*.

Then, the arc discharge generator 32 on the second target 33*b* side generates an arc discharge to ionize the metal zirconium of the second target 33*b* on the cathode side. Together with the Nitrogen, the zirconium ions generated in the reaction chamber 31 are attracted to the side of the piston ring base material 25, to which the bias potential is set. Therefore the zirconium nitride layer 22 is formed on the vanadium nitride layer 21 (see FIG. 4). At this time, the zirconium nitride layer 22 is formed in a wave shape along the vanadium nitride layer 21. In such a manner, a step of forming the vanadium nitride layer 21 and a step of forming the zirconium nitride layer 22 are alternately performed, so that the nitride film 20 shown in FIG. 4 is formed. Namely, in this manufacturing method, the wave shape of the vanadium nitride layer 21 and the zirconium nitride layer 22 can be controlled by adjusting the wave-pitch and wave-height of the wave shape of the outer circumferential surface 25*a*, which forms the base of the nitride film 20. Further, the wave shape of the nitride film 20 also can be controlled by changing a lamination interval of the vanadium nitride layer 21 and the zirconium nitride layer 22. Incidentally, the lamination interval means the thickness of a basic structure (layer) of the vanadium nitride layer 21 and the zirconium nitride layer 22, which form the nitride film 20.

Herein, by completely independently performing the step of forming the vanadium nitride layer 21 and the step of forming the zirconium nitride layer 22, mixing of the atom of vanadium and the atom of zirconium to each other on the interface therebetween can be restricted to the minimum. However, from the point of view of film-forming efficiency, it is preferred that vanadium and zirconium are supplied at the same time from different directions to the rotating piston ring base material 25, so that the nitride film 20 can be quickly formed. In such a case, although the nitride film 20 having a multi-layer structure as shown in FIG. 4 can be formed, there is a possibility that a zone where atoms of vanadium and atoms of zirconium are mixed to each other will be formed near the interface between the respective nitride layers. Even in such a case, the piston ring R is still excellent in wear resistance and seizure resistance as compared with a conventional piston ring (refer to, for example, Patent Document 1 and Patent Document 2).

In such a manner, a plurality of wave-shaped vanadium nitride layers 21 and a plurality of wave-shaped zirconium nitride layers 22 are respectively formed on the outer circumferential surface 25*a* of the piston ring base material 25, and finally, the surface is properly polished by lapping or the like, which completes the manufacture of the piston ring R. As shown in FIG. 2, both the vanadium nitride layer 21 and the zirconium nitride layer 22 are exposed on the outer circumferential sliding surface 17 (see FIG. 1) of a such manufactured piston ring R to form a sea and islands structure.

Note that the present invention includes other embodiments instead of being limited to the above embodiment.

Although the present embodiment discloses the piston ring R having the nitride film 20 formed by the vanadium nitride layer 21 and the zirconium nitride layer 22, the present invention may alternatively include the piston ring R having the nitride film 20 formed by the vanadium nitride layer 21 only. Further, in the present invention, titanium nitride layers can be formed as a substitute for the zirconium nitride layers 22, or the zirconium nitride layers 22 and the titanium nitride layers can coexist. Incidentally, in the case where the titanium nitride layers are formed instead of the zirconium nitride layers 22, a metal titanium (Ti), instead of the metal zirconium, can be used for the second target 33*b* in the manufacturing process of the piston ring R; and in the case where the zirconium nitride layer 22 and the titanium nitride layers are both formed, the piston ring R can be manufactured using a manufacturing device 30 having a third target formed of a metal titanium (not shown) in addition to the second target 33*b*.

Further, although the vanadium nitride layer 21 is formed on the outer circumferential surface 25*a* of the piston ring base material 25 according to the present embodiment, the present invention is not limited thereto but includes an arrangement in which the vanadium nitride layer 21 is formed on the outer circumferential surface 25*a* of the piston ring base material 25 through at least either one of the zirconium nitride layer 22 and the titanium nitride layer (not shown).

Evaluation tests of the nitride film 20 of the piston ring R (see FIG. 4) according to the present embodiment will be described below.

TEST EXAMPLE 1

In test example 1, a below-described test piece was placed in the manufacturing device 30 as shown in FIG. 8, and a metal vanadium was provided respectively for the first target 33*a* and the second target 33*b*. a nitride film formed of the vanadium nitride was formed on the surface of the test piece. Incidentally, the thickness of the nitride film was 30 μm. The test piece was a stainless bar-shaped member (SU-12, 8 mm in outer diameter and 25 mm in length, made by Teikoku Piston Ring Co, Ltd), of which one end was mirror finished in sphere shape (R18 mm).

Then, the test piece having the nitride film formed on the surface thereof was subjected to a wear resistance test and a seizure resistance test using a reciprocating slide testing machine (made by Teikoku Piston Ring Co, Ltd).

<Wear Resistance Test>

A flat plate corresponding to the cylinder liner 2 (see FIG. 1) was prepared. The flat plate was formed of the aluminum-based composite 8 (see FIG. 3) having surface roughness of 1 μm (Rz). The aluminum-based composite 8 was formed by casting the aluminum (ADC12) into the three-dimensional net structure 7 (i.e., the spherical cells 5 and the communication holes 6) of the ceramic form 4 (see FIG. 3) formed of the alumina ($Al_2O_3$). Incidentally, the volume ratio Vf of the ceramic form 4 was 30%.

A relative wear loss of the nitride film was measured by sliding the spherical surface portion of the test piece against the flat plate. Note that the relative wear loss is a wear loss of the nitride film relative to the wear loss of the nitride film (formed of a chromium nitride) of the test piece made for a below-described test example 2, in which the wear loss of the nitride film is defined as "1". The relative wear loss is shown in table 1.

Incidentally, a pushing load of the test piece against the flat plate was set to 49N, and a reciprocating speed of the test piece relative to the flat plate was set to 200 cycles/min. A lubricating oil (a bearing oil added with carbon black) was applied on the flat plate, against which the test piece slid, at a ratio of 2 $cm^3$/h. Incidentally, the composition of the lubricating oil is assumed as a composition of a diesel deteriorated oil. Further, the "a" (atom %) in the column of the test example 1 of table 1 represents the composition ratio of vanadium contained in the metal atoms of the nitride film.

TABLE 1

| | Component of Nitride Film | Composition Ratio a (atom %) | Composition Ratio b (atom %) | b/(a + b) | Relative Wear Loss | Relative Seizure Load |
|---|---|---|---|---|---|---|
| Test Example 1 | VN | 100 | 0 | 0 | 0.2 | 1 |
| Test Example 2 | VN—ZrN | 70 | 30 | 0.3 | 0.15 | 1.7 |
| Test Example 3 | VN—ZrN | 50 | 50 | 0.5 | 0.18 | 1.8 |
| Test Example 4 | VN—ZrN | 30 | 70 | 0.7 | 0.35 | 2.1 |
| Test Example 5 | VN—TiN | 70 | 30 | 0.3 | 0.25 | 1.3 |
| Test Example 6 | VN—TiN | 50 | 50 | 0.5 | 0.25 | 1.3 |
| Test Example 7 | VN—TiN | 30 | 70 | 0.7 | 0.4 | 1.4 |
| Comparative Example 1 | ZrN | 0 | 100 | 1 | 1 | 2.2 |
| Comparative Example 2 | CrN | — | — | — | 1 | 1 |
| Comparative Example 3 | TiN | 0 | 100 | 1 | 0.75 | 1.4 |

<Seizure Resistance Test>

The relative seizure load of each test piece was measured by sliding the spherical surface portion of the test piece against a flat plate identical to the flat plate used in the wear resistance test. Note that the relative seizure load is a seizure load of the nitride film relative to the seizure load of the nitride film (formed of the chromium nitride) of the test piece made for the below-described test example 2, in which the seizure load of the nitride film is defined as "1". The relative seizure load is shown in Table 1. Incidentally, the seizure load is measured in a manner in which initial value of the pushing load of the test piece against the flat plate is set to 19.6N, and the pushing load is increased at a ratio of 9.8N/30s. The pushing load when the test piece was burn into the flat plate was defined as the seizure load. The relative seizure load of the nitride film is shown in table 1. The reciprocating speed of the test piece relative to the flat plate was set to 200 cycles/min. A bearing oil as the lubricating oil was applied on the flat plate, against which the test piece slid. The quantity of the bearing oil to be applied was controlled to be such a level that it is equal to the quantity of the bearing oil remaining on the flat plate after being extended over the flat plate and then wiped off using a cloth.

TEST EXAMPLE 2 TO 4

In test example 2 to 4, a test piece identical to the test piece of the test example 1 was placed in the manufacturing device 30 as shown in FIG. 8, and a metal vanadium was provided for the first target 33*a* and a metal zirconium was provided for the second target 33*b*. A nitride film (thickness: 30 μm) was formed on the surface of the test piece by alternately laminating the vanadium nitride layer and the zirconium nitride layer on the surface of the test piece. The lamination interval of the nitride film was in the range of 40 to 70 nm. Herein the lamination interval means the thickness of a basic structure (layer) of the respective layers forming the nitride film. The composition ratios (atom %) of vanadium and zirconium of the nitride film coated on the test piece were measured for each of test examples 2 to 4. The result is shown in table 1. Incidentally, the "a" (atom %) of columns of the test examples 2 to 4 of table 1 represent the composition ratio of vanadium contained in the metal atoms of the nitride film, and the b (atom %) represent the composition ratio of zirconium. Further, the expression of "b/(a+b)" is also indicated in table 1 (note that in the following paragraphs, there are cases where "b/(a+b)" is used to express the composition rate of zirconium in the nitride film).

The relative wear loss and the relative seizure load of the test piece coated with the nitride film were measured for each of test examples 2 to 4 in the same manner as for test example 1. The result is shown in table 1.

TEST EXAMPLES 5 TO 7

In test example 5 to 7, a test piece identical to the test piece of the test example 1 was placed in the manufacturing device 30 as shown in FIG. 8, and a metal vanadium was provided for the first target 33*a* and a metal titanium was provided for the second target 33*b*. A nitride film (thickness: 30 μm) was formed on the surface of the test piece by alternately laminating the vanadium nitride layer and the titanium nitride layer on the surface of the test piece. The lamination interval of the nitride film was in the range of 40 to 70 nm. The composition ratios (atom %) of the vanadium and the titanium of the nitride film coated on the test piece were measured for each of test examples 5 to 7. The result is shown in table 1. Incidentally, the "a" (atom %) of the columns of the test examples 5 to 7 of table 1 represent the composition ratio of vanadium contained in the metal atoms of the nitride film, and the "b" (atom %) represent the composition ratio of titanium. Further, the expression of "b/(a+b)" is also indicated in table 1 (in the following paragraphs, there are cases where "b/(a+b)" is used to express the composition rate of titanium in the nitride film).

The relative wear loss of the test piece coated with the nitride film was measured for each of test examples 5 to 7 in the same manner as for test example 1. The result is shown in table 1.

COMPARATIVE EXAMPLE 1

In comparative example 1, a test piece identical to the test piece of the test example 1 was placed in the manufacturing device 30 as shown in FIG. 8, and a metal zirconium was respectively provided for the first target 33*a* and the second target 33*b*. A nitride film (thickness: 30 μm) formed of the zirconium nitride was formed on the surface of the test piece.

The relative wear loss and the relative seizure load of the test piece coated with the nitride film were measured in the same manner as for test example 1. The result is shown in table 1. The "b" (atom %) in the column of the comparative example 1 of table 1 represents the composition ratio of zirconium contained in the metal atoms of the nitride film.

COMPARATIVE EXAMPLE 2

In comparative example 2, a test piece identical to the test piece of the test example 1 was placed in the manufacturing device 30 as shown in FIG. 8, and a metal chromium was provided respectively for the first target 33*a* and the second target 33*b*. A nitride film (thickness: 30 μm) formed of the chromium nitride (CrN) was formed on the surface of the test piece.

The relative wear loss and the relative seizure load of the test piece coated with the nitride film were measured in the same manner as for test example 1. The result is shown in table 1.

COMPARATIVE EXAMPLE 3

In comparative example 3, a test piece identical to the test piece of the test example 1 was placed in the manufacturing device 30 as shown in FIG. 8, and a metal titanium was provided respectively for the first target 33*a* and the second target 33*b*. A nitride film (thickness: 30 μm) formed of the titanium nitride was formed on the surface of the test piece.

The relative wear loss and the relative seizure load of the test piece coated with the nitride film were measured in the same manner as for test example 1. The result is shown in table 1. The "b" (atom %) in the column of the comparative example 3 of table 1 represents the composition ratio of titanium contained in the metal atoms of the nitride film.

(Evaluation on Wear Resistance Test and Seizure Resistance Test)

As shown in table 1, the test pieces of test examples 1 to 4 (corresponding to the piston ring R of the present embodiment) formed with the nitride film including the vanadium nitride layers have far less relative wear loss and more excellent wear resistance than the test piece of comparative example 2 (corresponding to a conventional piston ring) formed with the chromium nitride layer. Further, the test piece formed with the nitride film as shown in test example 1 has the same seizure resistance as that of the test piece formed with the chromium nitride layer (comparative example 2). Further, the test pieces formed with the nitride films as shown in test examples 2 to 4 have far more excellent seizure resistance than that of the test piece formed with the chromium nitride layer (comparative example 2). Further, the test pieces of the test examples 1 to 4 have more excellent wear resistance than the test piece formed with the zirconium nitride layer only (comparative example 1).

Further, the test pieces of test examples 5 to 7 (corresponding to the piston ring R of the present embodiment) formed with the nitride film including the vanadium nitride layers and the titanium nitride layers have far less relative wear loss and more excellent wear resistance than the test piece of comparative example 2 (corresponding to a conventional piston ring) formed with the chromium nitride layer. Further, the test pieces of the test examples 5 to 7 have more excellent wear resistance compared with the test piece formed with the titanium nitride layer only (comparative example 3).

Figure 9:
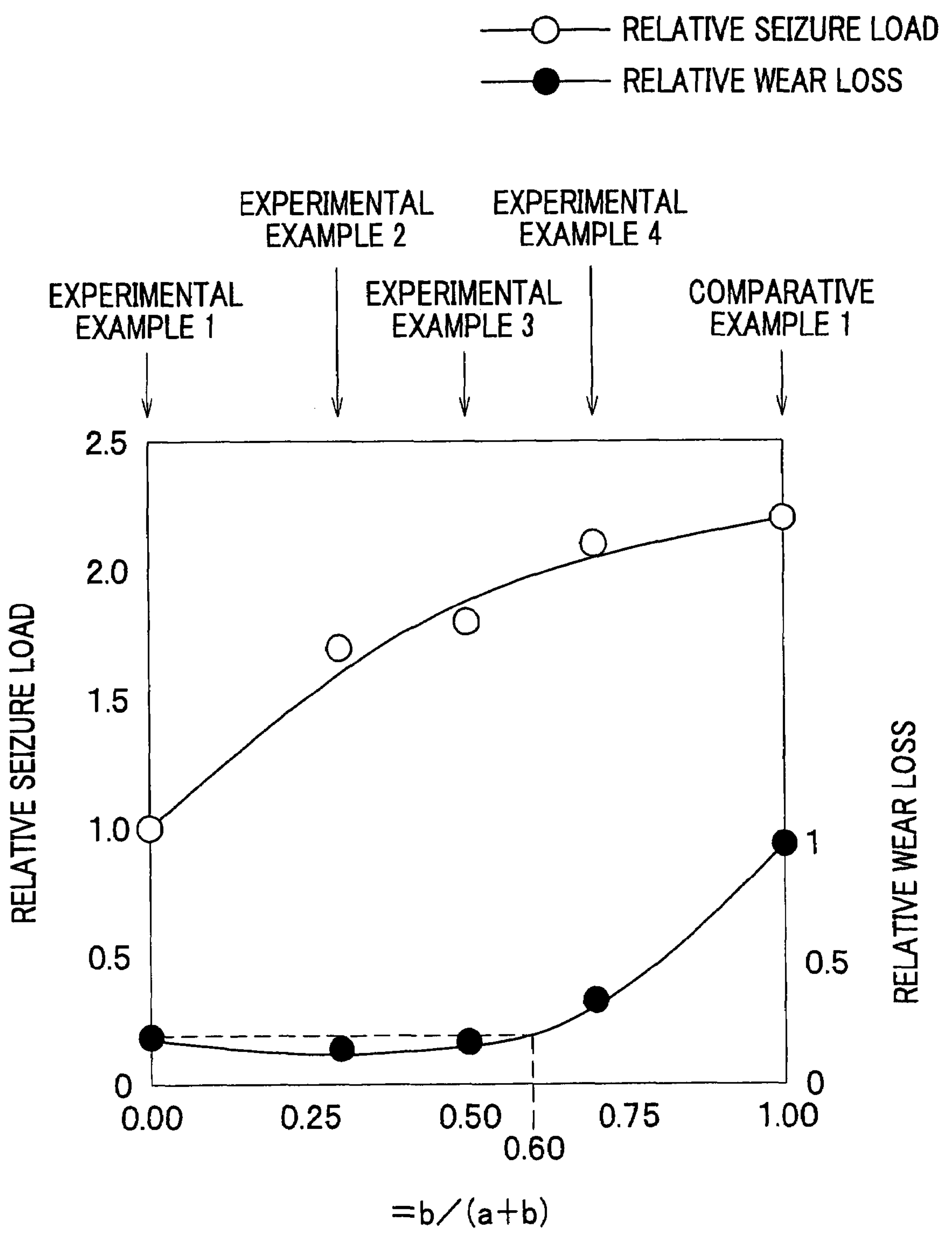
FIG. 9 is a graph showing the relation between a relative wear loss and a relative seizure load of the nitride film, with respect to the composition rate [b/(a+b)] of zirconium contained in the nitride film shown in test examples 1 to 4 and comparative example 1.

FIG. 9 is a graph showing a relation between the relative wear loss and the relative seizure load of the nitride film, with respect to the composition rate [b/(a+b)] of zirconium contained in the nitride film shown in test examples 1 to 4 and comparative example 1.

As shown in FIG. 9, the test piece of test examples 2 to 4, of which the nitride film further includes the zirconium nitride layers, have far greater relative seizure load and more excellent seizure resistance than the test piece of test example 1, of which the nitride film includes no zirconium nitride layer.

Further, as shown in FIG. 9, the test piece formed with the nitride film consisted of the zirconium nitride layer only (see comparative example 1) has greater relative wear loss than the test piece formed with the nitride film including no zirconium nitride layer (see test example 1). Thus, it is a general thought that the higher the quantity of the zirconium nitride contained in the nitride film is, the greater the wear loss of the nitride film is caused. However, contrary to general expectation, when quantity of the zirconium nitride in the nitride film is within a predetermined range, more specifically, when the composition rate [b/(a+b)] of the zirconium nitride in the nitride film does not exceed 0.60, the test piece formed with a nitride film including zirconium nitride layer has smaller relative wear loss than the test piece formed with a nitride film including no zirconium nitride layer (see test example 1).

Thus, the test piece having the composition rate [b/(a+b)] satisfying the equation "$0<b/(a+b)<0.6$" has more excellent wear resistance than test piece having composition rate beyond that range, and has more excellent seizure resistance than the chromium nitride (comparative example 2) in the conventional piston ring, and therefore is most preferable to be selected.

What is claimed is:

1. An engine comprising:

a cylinder block whose cylinder liner portion is formed of an aluminum-based composite reinforced by a ceramic containing at least either of a silicon carbide and an alumina; and a piston ring coated with a nitride film including a vanadium nitride layer and at least either a zirconium nitride layer or a titanium nitride layer, wherein the vanadium nitride layer and at least either the zirconium nitride layer or the titanium nitride layer are stacked repeatedly and alternately, and exposed on an outer circumferential sliding surface to form a sea and islands structure, and the stacked layers are formed in a wave shape, and wherein the ceramic for reinforcing the cylinder liner portion is a porous ceramic whose pores are filled with aluminum, the pores consisting of a plurality of spherical cells and a plurality of communication holes which are linked to each other to form a three-dimensional network structure, in which the plurality of the spherical cells have substantially uniform inner diameter and are closely arranged, and the plurality of the communication holes communicate the plurality of spherical cells adjacent to each other.

2. The engine according to claim 1, wherein in the nitride film, the composition ratio of vanadium and the composition ratio of zirconium or titanium satisfy the following equation:

$$0<b/(a+b)\leqq 0.6$$

where:

"a" represents atom % of vanadium, and

"b" represents atom % of zirconium or titanium.

3. The engine according to claim 1, wherein the volume ratio Vf of the ceramic for reinforcing the cylinder liner portion is within a range of 10%<Vf<40%.

* * * * *